(12) United States Patent
Beard et al.

(10) Patent No.: US 6,825,728 B1
(45) Date of Patent: Nov. 30, 2004

(54) METHOD AND DEVICE FOR GENERATING FREQUENCY ADJUSTMENT PARAMETERS FOR A VOLTAGE CONTROLLED OSCILLATOR

(75) Inventors: Paul F. Beard, Milpitas, CA (US); Eric Mitchell, Lake Oswego, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/356,449

(22) Filed: Jan. 31, 2003

(51) Int. Cl.$^7$ .................................................. H03L 7/00
(52) U.S. Cl. .......................................... 331/1 A; 331/17
(58) Field of Search .................... 331/1 A, 17; 327/159, 327/160

(56) References Cited

U.S. PATENT DOCUMENTS 4,121,162 A * 10/1978 Alberkrack et al. ...... 455/180.1

6,329,855 B1 * 12/2001 Horie .......................... 327/159

* cited by examiner

*Primary Examiner*—Benny Lee
*Assistant Examiner*—Joseph Chang
(74) *Attorney, Agent, or Firm*—Wagner, Murabito & Hao LLP

(57) ABSTRACT

A method for generating parameters for adjusting the frequency of a VCO. A desired carrier frequency may be based off the output of the VCO. The method determines parameters that are operable to adjust the frequency of the VCO, based on the channel number. The channel number may be input into combinatorial logic to determine the parameters. Offsets, which may be scaled, may be added to the channel number before determining the parameters, wherein the frequency of the VCO is further adjusted based on the offset(s). A first parameter may be operable to select a frequency scalar in a circuit with the VCO. A second parameter may be operable to generate a feedback signal for adjusting the frequency of the VCO.

18 Claims, 4 Drawing Sheets

200

300

METHOD AND DEVICE FOR GENERATING FREQUENCY ADJUSTMENT PARAMETERS FOR A VOLTAGE CONTROLLED OSCILLATOR

FIELD OF THE INVENTION

The present invention relates to the field of electronic circuits. Specifically, embodiments of the present invention relate to an improved method for generating parameters for causing a voltage-controlled oscillator to operate at a desired frequency.

BACKGROUND ART

Conventional wireless transceivers use a phase locked loop (PPL) having a voltage controlled oscillator (VCO) for establishing a carrier frequency. A conventional wireless transceiver may be required to operate at many different carrier frequencies, depending upon which channel a user desires to operate and other factors. For example, there may be a number of channels each a with carrier frequency at a specific frequency between a range from 2.4 GHz to 2.8 GHz.

The carrier frequency may be based off the output of the VCO, so to create the appropriate carrier frequency the frequency of the VCO is adjusted. In order to accurately adjust the VCO, typically a signal output by the VCO is divided in frequency and compared to a reference signal by a frequency and phase detector. Based on the comparison, the VCO's frequency is adjusted up or down so that the target carrier frequency is achieved from the VCO output signal.

Conventionally, when the VCO signal's frequency is divided down, the frequency is scaled according to a precise timing pattern. For example, the frequency may be scaled by a first factor for 'x' cycles and then by a second factor for one or more cycles. In this fashion, the VCO signal is divided to a very precise frequency. In order to trigger which frequency scaling factor used, conventional techniques produce a counter value that is appropriate for the desired carrier frequency. When the counter reaches zero, the frequency scaling factor is changed.

Conventionally, a second counter value is used to produce a feedback signal from the frequency scaled signal. The feedback signal Is then compared to a reference signal. Conventionally, the second counter is used to determine when the frequency divided signal is fed back to a phase and frequency detector to be compared to the reference signal. The conventional method must have a way of producing a second counter that will produce the feedback signal at the appropriate time to correctly adjust the VCO such that the desired carrier frequency is produced.

A first conventional technique for producing the first and second counters is a lookup table containing first and second counter values corresponding to each of the possible carrier frequencies. This table can be very large as not only are there separate carrier frequencies for different broadcast channels, but a given broadcast channel typically may have multiple carrier frequencies based on a variety of factors such as local broadcast regulations. Unfortunately, the lookup table can consume considerable area on the transceiver chip. When area is at a premium, this solution is very costly.

A second conventional solution is to use a processor to generate suitable counter values. However, the generation of proper values is not trivial. Thus, this solution is costly from a standpoint of consuming valuable processor cycles. In applications in which processor cycles are precious, this solution is undesirable. Thus, a need exists for a method for adjusting the frequency of a VCO that does not consume valuable processor cycles or chip space with look up tables or the like. A further need exists for a method of generating a carrier frequency that does not consume valuable processor cycles or chip space with look up tables or the like.

SUMMARY OF THE INVENTION

Embodiments of the present invention provide a method and device for adjusting the frequency of a VCO that do not consume valuable processor cycles or considerable chip space with look up tables or the like. Embodiments of the present invention provide a method and device of generating a carrier frequency that do not consume valuable processor cycles or considerable chip space with lookup tables. Embodiments of the present invention provide these advantages and others not specifically mentioned above but described in the sections to follow.

Embodiments of the present invention provide a method and device for generating parameters for adjusting the frequency of a VCO. A desired carrier frequency may be based off the output of the VCO. A method embodiment for generating parameters for adjusting the frequency of a VCO comprises receiving a channel number. The method determines a first parameter that is operable to adjust the frequency of the VCO, based on the channel number. The method also determines a second parameter operable to adjust the frequency of the VCO, based on the channel number. The first parameter may be used to select a frequency scalar in a closed loop with the VCO. The second parameter may be used to provide a feedback signal to adjust the frequency of the VCO.

The above method may further include inputting the channel number into combinatorial logic to determine the first and second parameters. The method may still further include adding one or more offsets to the channel number before determining the first and second parameters, wherein the frequency of the VCO is further adjusted based on the offset(s).

Another embodiment of the present invention is a device for adjusting the frequency of a VCO. The device comprises logic that is operable to receive a channel number and to produce oscillator adjustment parameters based on the channel number. The device also includes registers for receiving the oscillator adjustment parameters. The parameters may be used to select a frequency scalar in a closed loop with the VCO and to provide a feedback signal to adjust the frequency of the VCO.

The device may further comprise a register coupled to the logic that is operable to hold an offset to add to the channel number. In this fashion, the frequency of the VCO may be further adjusted, based on the offset in the register.

Another method embodiment is for producing a signal having a desired carrier frequency. This method includes receiving a channel number and inputting the channel number into combinatorial logic to determine a plurality of parameters that are operable to adjust the frequency of a VCO, based on the channel number. The plurality of parameters are applied in a circuit comprising the VCO to adjust the frequency of the VCO to produce a desired carrier frequency that is derived from the VCO.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

In the following detailed description of the present invention, a method and device for generating parameters for adjusting the frequency of a voltage controlled oscillator, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Figure 1:
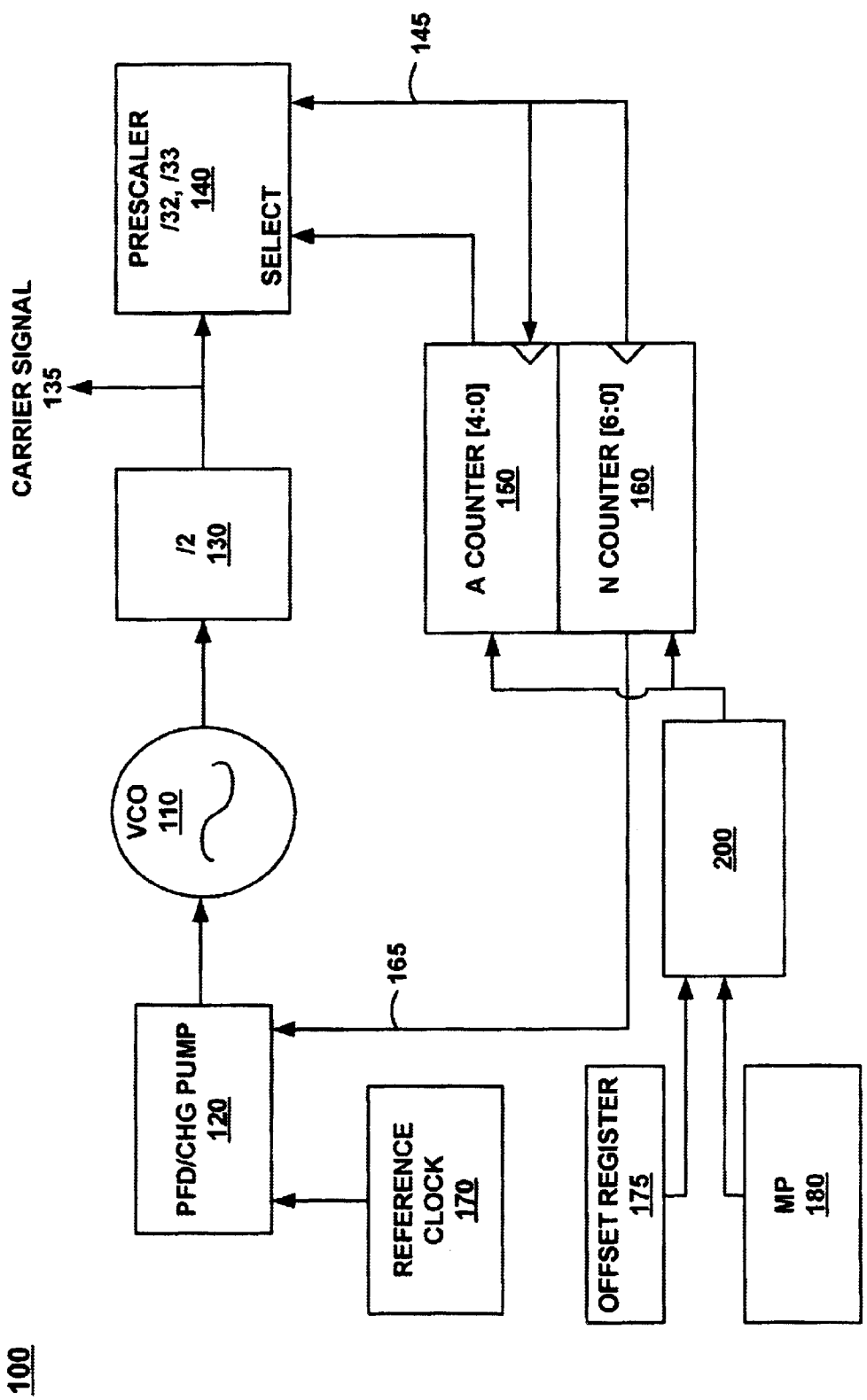
FIG. 1 is block diagram of a phase locked loop having a VCO for which embodiments of the present invention provide operating/control parameters.

FIG. 1 is block diagram of a phase locked loop 100 having a voltage controlled oscillator (VCO) 110 for which embodiments of the present invention provide operating/control parameters. A VCO 110 is coupled to a phase and frequency detector/charge pump PFD/CP 120. The frequency of the VCO 110 is adjustable based on the signal from the PFD/CP 120. The output of the VCO 110 is divided in frequency by two by the logic 130 to produce a signal with a frequency suitable for a carrier signal 135.

The prescalar logic 140 is able to divide the frequency of the carrier signal 135 by a first or second scaling factor, based on its select input. In this example, the prescalar divides the frequency by either 32 or 33, although any values can be used. In this example, the "A" counter 150 contains a five bit value that decrements each cycle of the prescalar signal 145, which it receives from the prescalar logic 140. When the value in the "A" counter 150 hits zero, the "A" counter 150 may output a signal to the select of the prescalar logic 140. Thus, the "A" counter 150 controls whether the prescalar divides the frequency by 32 or 33, in this example. Embodiments of the present invention generate a suitable value for the "A" counter 150, based on a channel number and other factors. Selecting a suitable frequency scalar comprises a part of the process of adjusting the frequency of the VCO 110, such that a desired carrier frequency is made available. This can save both chip real estate and/or processor cycles over conventional methods of determining a suitable value for the "A" counter 150.

Continuing on with the description of FIG. 1, the prescalar 140 outputs the prescalar signal 145 to both the "A" counter 150 and an "N" counter 160. The "N" counter 150 outputs a feedback signal 165 to the PFD/CD 120, which may be compared to the output of the reference clock 170. Based on this comparison, the VCO 110 may be frequency adjusted by the VCO/CP 120. The "N" counter 160 contains a value that may be decremented every cycle of the prescalar signal 145 until it reaches zero, in which case it outputs the feedback signal 165.

Embodiments of the present invention produce a suitable value for the "N" counter 160, based on a channel number and other factors.

The PLL/VCO 100 of FIG. 1 also has calculation logic 200 for generating the values for the "A" counter 150 and the "N" counter 160. The calculation logic 200 may receive data from the microprocessor 180, such as a channel number and a bit describing whether the PPLNCO 100 is currently being used to receive or transmit. The offset register(s) 175 may contain an offset(s) that may be Input to the calculation logic 200 for adjusting the VCO 110 based on factors other than the channel number.

Figure 2:
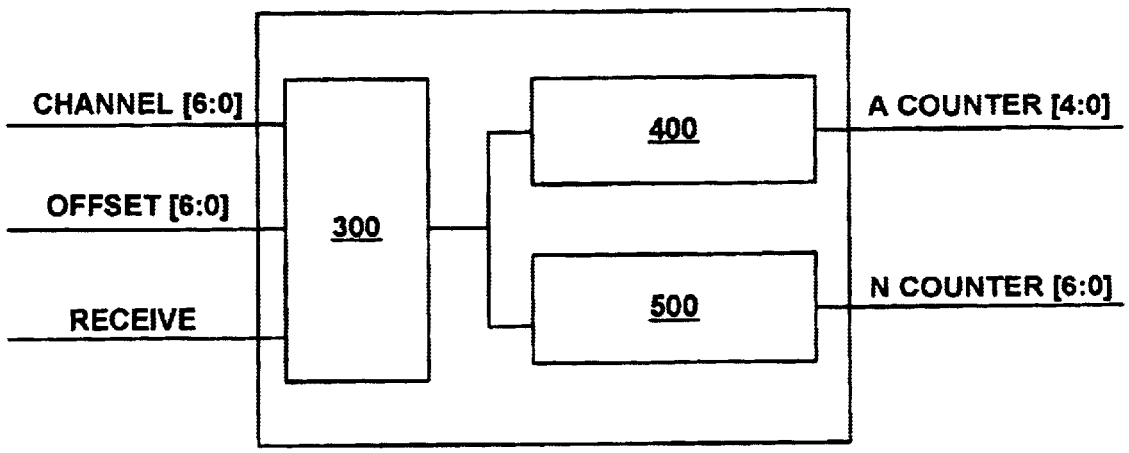
FIG. 2 is a block diagram of logic for generating parameters for adjusting the frequency of a VCO, according to an embodiment of the present invention.

FIG. 2 is a block diagram showing exemplary inputs and outputs of the calculation logic 200 for generating frequency adjustment parameters that are operable to adjust the frequency of a VCO in a circuit such as the PPL/VCO 100 of FIG. 1. It will be understood that the inputs and outputs are exemplary and that many variations are possible within the spirit and scope of the present invention. The calculation logic 200 may be implemented with combinatorial logic, although the present invention is not so limited.

In this embodiment, the parameters that the calculation logic 200 outputs are an "A" counter value and an "N" counter value. These counters may be used in the PPLVCO of FIG. 1, although it is not required that the PPL/VCO of FIG. 1 be used. Moreover, the present invention may generate parameters other than an "A" counter value and an "N" counter value that are operable to adjust the frequency of a VCO.

The calculation logic 200 receives a broadcast channel number. In the present embodiment, the channel number is seven bits, although the present invention is not so limited. The channel number itself may be supplied in a conventional fashion. For example, a processor may provide the channel number in response to a user selection. The channel number affects what carrier frequency is required. For example, if the channel is "0", then the carrier frequency may need to be 2.400 GHz to comply with the standards of the particular technology and local broadcasting regulations. If the channel is "10", then the carrier frequency may need to be 2.410 GHz to comply as such.

However, the carrier frequency may depend on a number of factors. For example, in the United States the carrier frequency assigned to channel "0" may be 2.400 GHz, whereas in Europe the assigned carrier frequency for channel "0" may be 2.423 GHz. The calculation logic 200 inputs an offset to automatically compensate for such differences and produce appropriate parameters. The offset register 175 of FIG. 1 may provide this value. In the present example, the same non-zero offset may be used regardless of the channel number if the transceiver is being used in Europe, whereas the offset may be zero if the transceiver is being used in the United States. The present invention is well suited to selecting an appropriate offset based on other factors. In the present embodiment, the offset is the same number of bits as the channel number, although the present invention is not so limited. Embodiments of the present invention store one or more such offsets.

The calculation logic 200 also receives a receive/transmit bit or flag, in this example. The calculation logic may adjust the value of the frequency adjustment parameters based on the setting of this bit. The bit may correspond to whether the transceiver is being used to transmit or receive at this time. For example, the required carrier frequency for transmission may be different for that of reception. As one example, transmission over a given channel may require a carrier frequency of 2.400 GHz, whereas reception on the same channel may require a carrier frequency that is 2 MHz higher (e.g., 2.402 GHz). The receive/transmit bit may come from a processor, although the present invention is not so limited.

Figure 3:
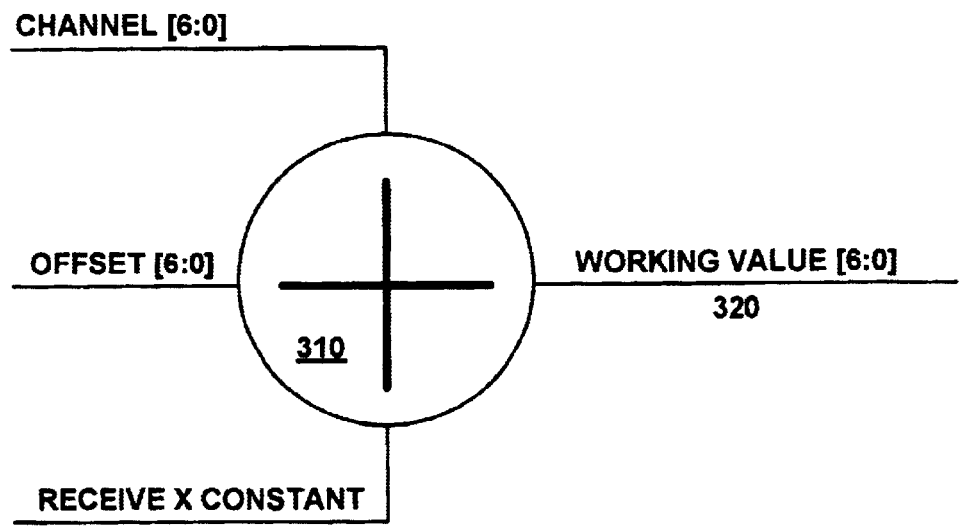
FIG. 3 is a diagram of logic for generating a working value based on inputs of the logic of FIG. 2, according to an embodiment of the present invention.
Figure 4:
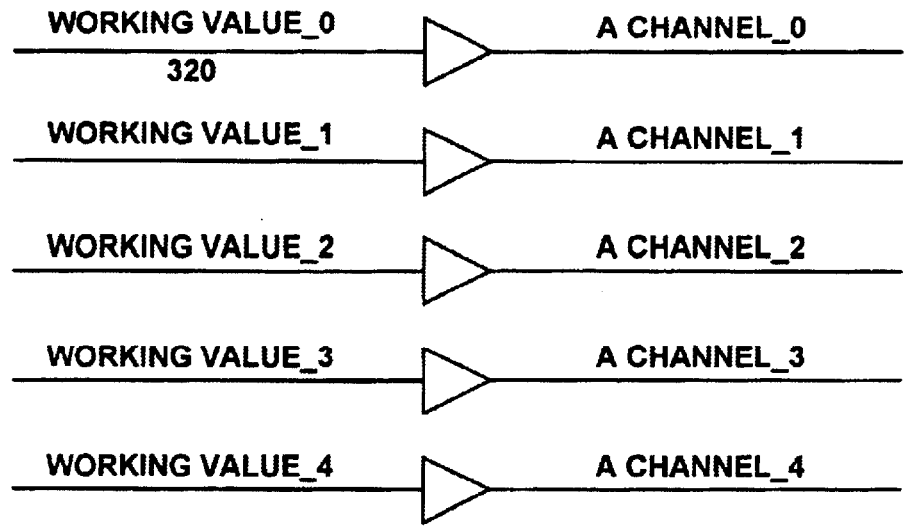
FIG. 4 is a diagram of logic for producing a frequency adjustment parameter, according to an embodiment of the present invention.
Figure 5:
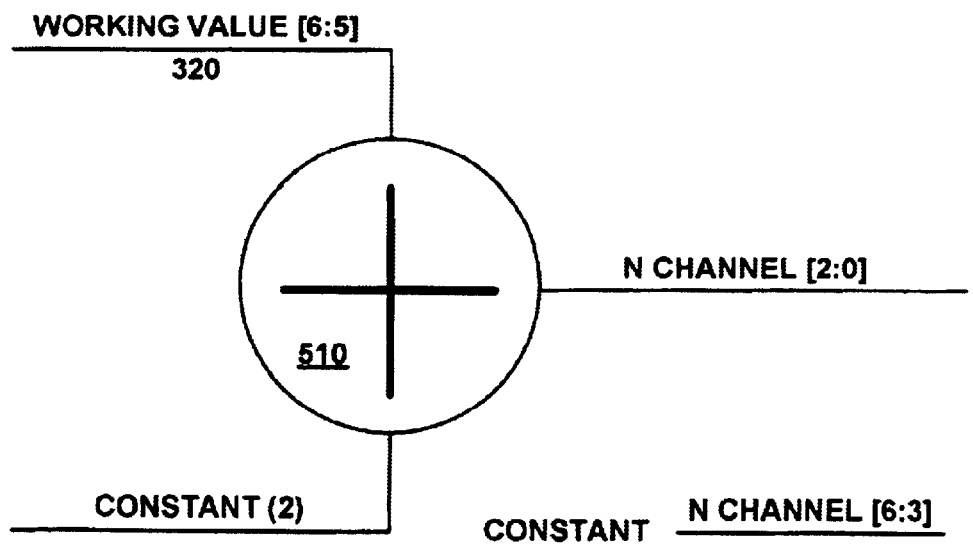
FIG. 5 is a diagram of logic for producing a frequency adjustment parameter, according to an embodiment of the present invention.
Figure 6:
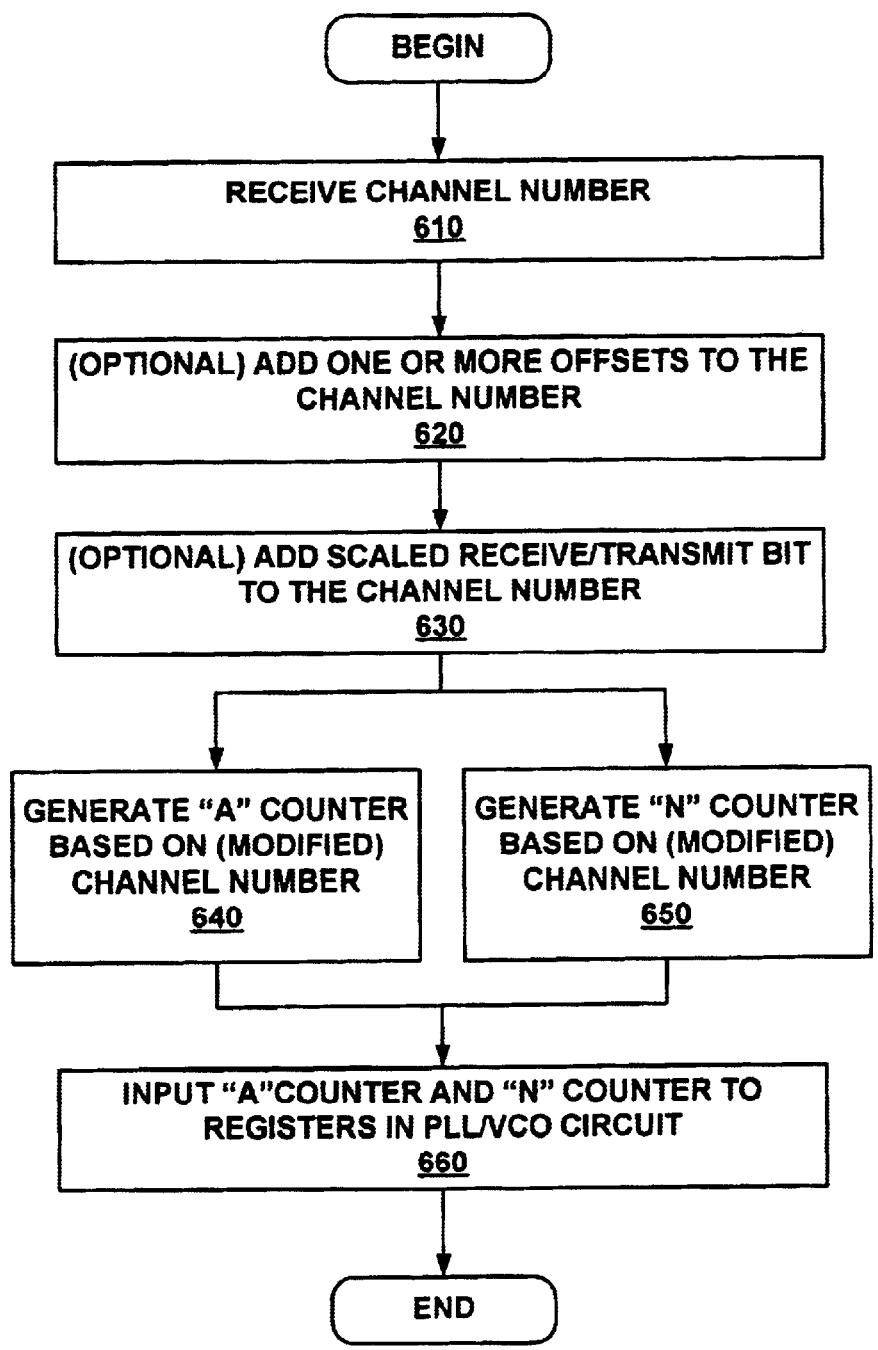
FIG. 6 is a flowchart illustrating steps of a process of generating parameters for adjusting the frequency of a VCO, according to an embodiment of the present invention.

The calculation logic 200 of FIG. 2 includes input logic 300, "A" counter generator logic 400, and, "N" counter generator logic 500 whose details are shown in FIGS. 3, 4 and 5, respectively.

FIG. 3 is the input logic 300 showing one way in which the inputs to the calculation logic may be combined to produce a working value 320 to be input to later stages. It will be understood that the present invention is not limited to this technique. The exemplary input stage 300 has an adder 310 that sums the channel number, the offset, and the product of the receive/transmit bit and a constant. However, the present invention is well suited to other variations, such as adding other offsets, applying scaling factors to the inputs, using a relationship other than summing the inputs, etc. For example, the constant that multiplies the receive/transmit bit may "2" in order to cause the carrier frequency to increase by 2 MHz if the generated parameters are applies to a PPLNCO such as in FIG. 1. The constant maybe set to an appropriate predetermined value to cause the desired modification to the carrier frequency. However, the constant need not always be the same. For example, logic such as a MUX (not shown) may be used to feed in one of a plurality of constants to multiply against the receive/transmit bit.

FIG. 4 illustrates one embodiment for generating "A" counter values. In the exemplary "A" counter generator logic 400, the lower five bits of the working value 320 are used for the five bits of the "A" counter parameter. Referring again to FIG. 1, when the "A" counter value is plugged into the "A" counter 150 of the PPL/VCO, the prescalar 140 is selected at the correct time to scale the frequency of the carrier signal 135 by the proper scaling factor. The present invention is well suited to other techniques of generating the "A" counter.

FIG. 5 illustrates exemplary "N" counter generation logic 500 for generating an "N" counter parameter from the working value 320. In this example, the upper two bits of the working value 320 are summed with a constant, which in this example is two. This produces a suitable value for the lower three bits of the "N" counter parameter. The upper four bits of the "N" counter parameter are always a constant, in this example. The upper bits are "1001", in this case. The constants may depend upon the particular technology for which the PPL/VCO was designed. Thus, in general the logic 500 is operable to produce an "N" channel parameter based on the working value 320.

An embodiment of the present invention is a method for generating parameters for adjusting the frequency of a VCO. The VCO may reside in a phase locked loop. Both may form a part of a wireless communication transceiver. In step 310, a channel number is received and converted to binary format, if necessary.

In optional step 320, one or more offsets are added to the channel number. Adding the offset(s) provides a way to adjust the frequency of the VCO and hence the carrier frequency. As already discussed, the required carrier frequency is not always the same for a given channel number. For example, in Europe the carrier frequency assigned to channel zero may be 2.423 GHz, whereas in the United States it may be 2.400 GHz. By adding an appropriate offset, this difference is automatically compensated for.

In optional step 330, a scaled receive/transmit bit may be added to the channel number. Thus, the value added is either zero or a constant. Adding this bit allows the frequency of the VCO to be further adjusted for another factor. For example, the required carrier frequency for wireless transmission may be different for that of reception. As one example, transmission may require a carrier frequency of 2.400 GHz, whereas reception requires a carrier frequency that is 2 MHz higher (e.g., 2.402 GHz). The added bit may cause the combinatorial logic to automatically generate a parameter that provides this further adjustment to the VCO frequency and hence carrier frequency.

Steps 340 and 350 generate parameters that are operable to adjust the frequency of the VCO. The channel number, as modified by steps 320 and 330, may be input into combinatorial logic, such as depicted in FIG. 2. The parameters may be taken from suitable output points of the combinatorial logic. The parameters may be an "A" counter and an "N" counter, although the present invention is not so limited.

In step 360, the parameters are input to registers in a PPL/VCO circuit. For example, a first parameter may be input to an "A" counter and a second parameter may be input to an "N" counter. The PPL/VCO circuit may operate in a conventional fashion, with the "A" counter selecting a frequency scaling factor and the "N" counter issuing a feedback signal to be compared to a known reference clock. In this fashion, the frequency of the VCO is adjusted, such that a carrier frequency based on the VCO output is appropriate for the channel number and other factors. The additional factors may include, but are not limited to, geographic requirements and transceiver mode (e.g., reception versus transmission).

The preferred embodiment of the present invention, a method and device for generating parameters for adjusting the frequency of a VCO, is thus described. While the present invention has been described in particular embodiments, it should be appreciated that the present invention should not be construed as limited by such embodiments, but rather construed according to the below claims.

What is claimed is:

1. A method for generating parameters for adjusting the frequency of a voltage controlled oscillator, comprising:
  a) receiving a channel number;
  b) determining a first parameter operable to adjust the frequency of said voltage controlled oscillator, based on said channel number, wherein said first parameter is further operable as a counter to select a frequency divide scalar; and
  c) determining a second parameter operable to adjust the frequency of said voltage controlled oscillator, based on said channel number.

2. The method of claim 1, wherein said b) comprises inputting said channel number into combinatorial logic to determine said first parameter.

3. A method for generating parameters for adjusting the frequency of a voltage controlled oscillator, comprising:
  a) receiving a channel number;
  b) determining a first parameter operable to adjust the frequency of said voltage controlled oscillator, based on said channel number; and
  c) determining a second parameter operable to adjust the frequency of said voltage controlled oscillator, based on said channel number, wherein said second parameter is operable as a counter to generate a feedback signal for adjusting the frequency of said voltage controlled oscillator.

4. A method for generating parameters for adjusting the frequency of a voltage controlled oscillator, comprising:
   a) receiving a channel number;
   b) adding an offset to the channel number before determining a first and a second parameter;
   c) determining said first parameter operable to adjust the frequency of said voltage controlled oscillator, based on said channel number and said offset; and
   d) determining said second parameter operable to adjust the frequency of said voltage controlled oscillator, based on said channel number and said offset, wherein the frequency of said voltage controlled oscillator is further adjusted based on said offset.

5. The method of claim 4, further comprising scaling said offset before determining said first and second parameters.

6. The method of claim 4, wherein said offset is added in response to a bit associated with said channel number being set, wherein said bit indicates whether said voltage controlled oscillator is currently being used in signal reception or transmission.

7. A device for adjusting the frequency of a voltage controlled oscillator, comprising:
   combinatorial logic operable to receive a channel number and to produce a first and a second frequency adjustment parameter based on said channel number;
   a first register coupled to said combinatorial logic and for receiving said first frequency adjustment parameter; and
   a second register coupled to said combinatorial logic and for receiving said second frequency adjustment parameter.

8. The device of claim 7, further comprising an offset register coupled to said combinatorial logic and operable to hold an offset to add to said channel number.

9. The device of claim 7, wherein said combinatorial logic further comprises an input stage operable to combine said channel number with one or more offsets to produce a working value for generating said first and second frequency adjustment parameters.

10. The device of claim 9, wherein said combinatorial logic further comprises a first parameter generator logic coupled to said input stage and operable to generate said first frequency adjustment parameter based on said working value.

11. The device of claim 10, wherein first parameter generator logic is further operable to receive a constant to use in generating said first frequency adjustment parameter.

12. The device of claim 7, wherein said first frequency adjustment parameter is operable to select a frequency scalar in a circuit having a voltage controlled oscillator.

13. The device of claim 12, wherein said second register is coupled to a phase and frequency detector coupled to a voltage controlled oscillator, wherein said second frequency adjustment parameter is operable to adjust the frequency of said voltage controlled oscillator.

14. A method for producing a carrier frequency comprising:
   a) inputting a channel number into combinatorial logic to determine a plurality of parameters operable to adjust the frequency of a voltage controlled oscillator based on said channel number, and scaling a bit an adding said scaled bit to said channel number, wherein said bit indicates whether said voltage controlled oscillator is currently being used in connection with signal reception or transmission; and
   b) applying said plurality of parameters in a circuit comprising said voltage controlled oscillator to adjust the frequency of said voltage controlled oscillator to produce a desired carrier frequency derived from said voltage controlled oscillator.

15. The method of claim 14, wherein said a) comprises adding an offset to the channel number before determining said plurality of parameters, wherein the frequency of said voltage controlled oscillator is further adjusted based on said offset.

16. The method of claim 15, wherein said a) further comprises scaling said offset before determining said plurality of parameters.

17. A method for producing a carrier frequency comprising:
   a) inputting a channel number into combinatorial logic to determine a plurality of parameters operable to adjust the frequency of a voltage controlled oscillator, based on said channel number; and
   b) said plurality of parameters in a circuit comprising said voltage controlled oscillator to adjust the frequency of said voltage controlled oscillator to produce a desired carrier frequency derived from said voltage controlled oscillator, wherein a first parameter of said plurality of parameters is operable as a counter to select between a plurality of frequency scalars in a closed loop with said voltage controlled oscillator.

18. The method of claim 17, wherein a second parameter of said plurality of parameters is operable as a counter to generate a feedback for adjusting the frequency of said voltage controlled oscillator.

* * * * *